United States Patent
Aso et al.

(10) Patent No.: US 9,161,483 B2
(45) Date of Patent: Oct. 13, 2015

(54) ELECTRONIC MODULE AND METHOD OF MANUFACTURING ELECTRONIC MODULE

(71) Applicants: Yoshiaki Aso, Tokyo (JP); Akira Akiyoshi, Tokyo (JP)

(72) Inventors: Yoshiaki Aso, Tokyo (JP); Akira Akiyoshi, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 186 days.

(21) Appl. No.: 13/754,307

(22) Filed: Jan. 30, 2013

(65) Prior Publication Data

US 2013/0194756 A1 Aug. 1, 2013

(30) Foreign Application Priority Data

Feb. 1, 2012 (JP) .................. 2012-020272

(51) Int. Cl.
*H05K 7/14* (2006.01)
*H05K 7/18* (2006.01)
*H05K 9/00* (2006.01)

(52) U.S. Cl.
CPC ............ *H05K 9/0024* (2013.01); *H05K 9/0045* (2013.01)

(58) Field of Classification Search
USPC ......... 361/737, 799, 816, 818, 720, 721, 748, 361/760, 803; 174/521, 260–262; 357/433, 357/667, 787–796, 779, 780
See application file for complete search history.

(56) References Cited

U.S. PATENT DOCUMENTS

| | | | |
|---|---|---|---|
| 5,172,077 A | 12/1992 | Funada | |
| 5,355,016 A * | 10/1994 | Swirbel et al. | 257/659 |
| 5,966,052 A * | 10/1999 | Sakai | 331/68 |
| 6,079,099 A * | 6/2000 | Uchida et al. | 29/837 |
| 6,881,896 B2 * | 4/2005 | Ebihara | 174/546 |
| 7,180,012 B2 * | 2/2007 | Tsuneoka et al. | 174/521 |
| 7,327,015 B2 * | 2/2008 | Yang et al. | 257/660 |
| 7,478,474 B2 * | 1/2009 | Koga | 29/841 |
| 7,989,928 B2 * | 8/2011 | Liao et al. | 257/659 |
| 8,022,511 B2 * | 9/2011 | Chiu et al. | 257/659 |
| 8,084,300 B1 * | 12/2011 | San Antonio et al. | 438/114 |
| 8,350,367 B2 * | 1/2013 | Chiu et al. | 257/659 |
| 8,368,185 B2 * | 2/2013 | Lee et al. | 257/659 |
| 8,410,584 B2 * | 4/2013 | An et al. | 257/660 |
| 8,704,341 B2 * | 4/2014 | Lin et al. | 257/659 |
| 2002/0153582 A1 * | 10/2002 | Takehara et al. | 257/433 |
| 2003/0011723 A1 * | 1/2003 | Ju | 349/58 |
| 2004/0252475 A1 | 12/2004 | Tsuneoka et al. | |
| 2012/0015687 A1 | 1/2012 | Yamada et al. | |
| 2012/0168214 A1 | 7/2012 | Kashiwagi et al. | |

FOREIGN PATENT DOCUMENTS

| | | |
|---|---|---|
| JP | H04-328903 | 11/1992 |
| JP | 2008-28200 | 2/2008 |
| JP | 4178880 | 11/2008 |
| JP | 2011-159788 | 8/2011 |

OTHER PUBLICATIONS

Japanese Office Action mailed Jun. 16, 2015.

* cited by examiner

*Primary Examiner* — Hung S Bui
(74) *Attorney, Agent, or Firm* — IPUSA, PLLC

(57) ABSTRACT

An electronic module includes a mold body in which an electronic component mounted on a circuit substrate is sealed by a mold resin; and a shield film formed to cover upper and side surfaces of the mold body, the shield film being a metal evaporated film formed by physical vapor deposition.

10 Claims, 7 Drawing Sheets

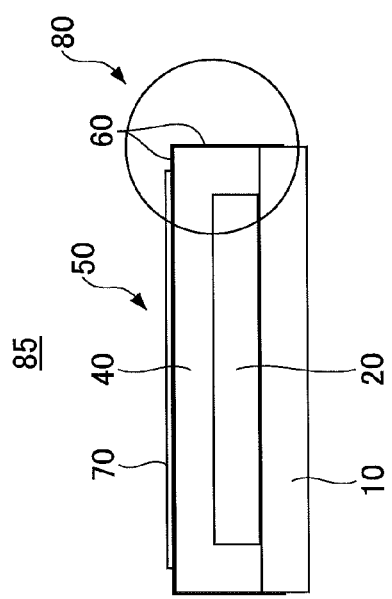
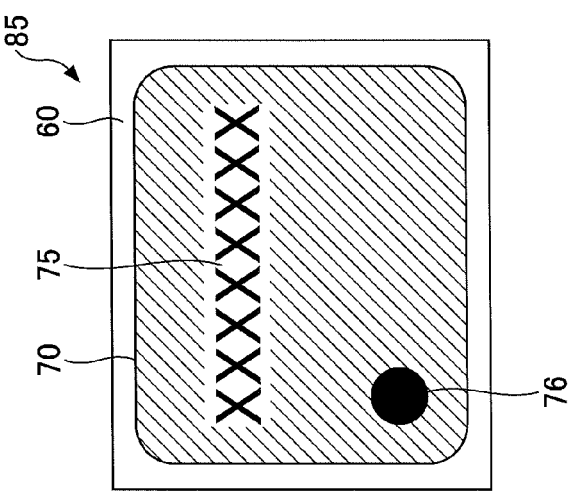
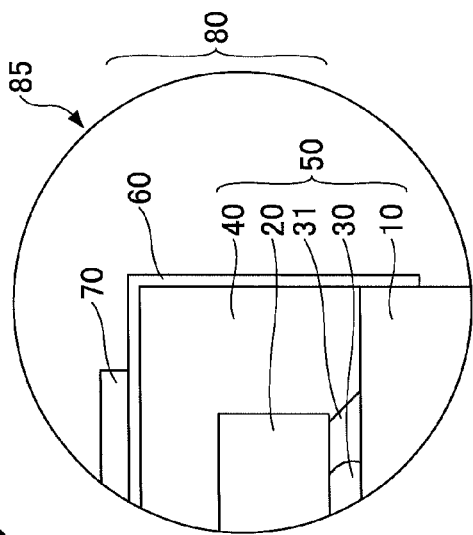

ELECTRONIC MODULE AND METHOD OF MANUFACTURING ELECTRONIC MODULE

BACKGROUND OF THE INVENTION

1. Field of the Invention

The present invention relates to an electronic module and a method of manufacturing the electronic module.

2. Description of the Related Art

An electronic module which functions as a part of an electronic device is known. Such an electronic module is mounted on an electronic device to have a predetermined function which is a part of that of the electronic device. For example, the electronic module may be a high-frequency module (radio frequency module) which has a communication function, capable of sending and receiving signals, of a communication device such as a mobile phone or the like in a radio communication device field.

As such an electronic module is used when mounted on the electronic device, the size of the electronic module is determined based on the size of the electronic device. When the electronic device is small, it is necessary to make the electronic module small as well.

Conventionally, when it is necessary to shield the electronic module, as for the case of the high-frequency module, the electronic module is housed in a metal shield case. However, it is necessary to ground the metal shield case by a ground pattern formed in a substrate on which the electronic module is mounted. Thus, in order to electrically connect the metal shield case with the ground pattern in the substrate, it is necessary to connect the metal shield case by a solder bump formed on a land formed at an upper surface of the substrate. Thus, it is necessary to form the land on the upper surface of the substrate within the metal shield case. This land may become larger as it is used for the largest component in the electronic module, so that the shield case needs also be made larger to accommodate the land.

Further, as the shield case is made of a conductive material, it is necessary to have enough space between the metal shield case and an outer case, which covers the entirety of the electronic component including the metal shield case. Thus, a dead zone is increased, thereby increasing the size of the electronic component. Further, as a shortage between the metal shield case and the upper electrode components formed at the upper surface of the substrate may occur, enough clearance is necessary to further increase the dead space.

Further, it is necessary for the shield case to have a thickness of at least about 100 μm in order to compose the electronic module, the size of the electronic module becomes larger at this point as well.

A module component without such a shield case is provided. The module component includes a circuit substrate on which an electronic component is mounted, a sealing body which seals the electronic component by a first resin, having a size the same as the circuit substrate and provided with a groove so that a ground pattern in the circuit substrate can be exposed from a bottom or side surface of the groove, a metal film which covers the upper and side surfaces of the sealing body and the circuit substrate by electroless plating and electroplating to be connected to the ground pattern in the substrate at the bottom or side surface of the groove, and a second resin which fills the groove (see Patent Document 1).

However, according to the conventional method disclosed in Patent Document 1, the metal film is formed using two different wet processes including a first process of forming a copper metal film by electroless plating and a second process of forming a dense metal film by electroplating. Thus, larger apparatuses are necessary for each of the wet processes and the manufacturing cost becomes high. It means that the sealing body which is made of resin is an insulating body and it is impossible to directly form a metal layer on the insulating body by electroplating. Thus, it is necessary to form a seed metal film on the insulating body by electroless plating, and then electroplating is performed using the seed metal film. Therefore, the two steps are necessary and the two kinds of apparatuses are necessary for the two steps, which increases the manufacturing cost.

Further, in both of the electroless plating and the electroplating, it is necessary to dip the sealing body with the circuit substrate in plating solutions, so that unnecessary metal film may be formed at a back side surface of the circuit substrate. Thus, a step of removing such an unnecessary metal film is further necessary.

Patent Document

[Patent Document 1] Japanese Patent No. 4,178,880

SUMMARY OF THE INVENTION

The present invention is made in light of the above problems, and provides an electronic module and a method of manufacturing the electronic module capable of surely obtaining a shield effect even when the size is small as well as scale-up with a low cost is possible.

According to an embodiment, there is provided an electronic module including a mold body in which an electronic component mounted on a circuit substrate is sealed by a mold resin; and a shield film formed to cover upper and side surfaces of the mold body, the shield film being a metal evaporated film formed by physical vapor deposition.

According to another embodiment, there is provided a method of manufacturing an electronic module including a substrate preparing step in which plural circuit areas are provided, each of the plural circuit areas being surrounded by dicing lines; a component mounting step in which plural electronic components are mounted on the plural circuit areas, respectively; a molding step in which the plural electronic components mounted on the substrate are sealed by a mold resin; a dicing step in which the substrate is cut along the dicing lines to individualize the sealed plural circuit areas and obtain plural mold bodies; and a shielding film forming step in which a metal evaporated film is formed on upper and side surfaces of each of the mold bodies by physical vapor deposition.

Note that also arbitrary combinations of the above-described constituents, and any exchanges of expressions in the present invention, made among methods, devices and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

FIG. 1A is a cross-sectional view showing an example of an electronic module of an embodiment;

FIG. 1B is a plan view showing an example of the electronic module of the embodiment;

FIG. 1C is an enlarged cross-sectional view showing a part of the electronic module shown in FIG. 1A;

DETAILED DESCRIPTION OF THE PREFERRED EMBODIMENTS

Figure 2:
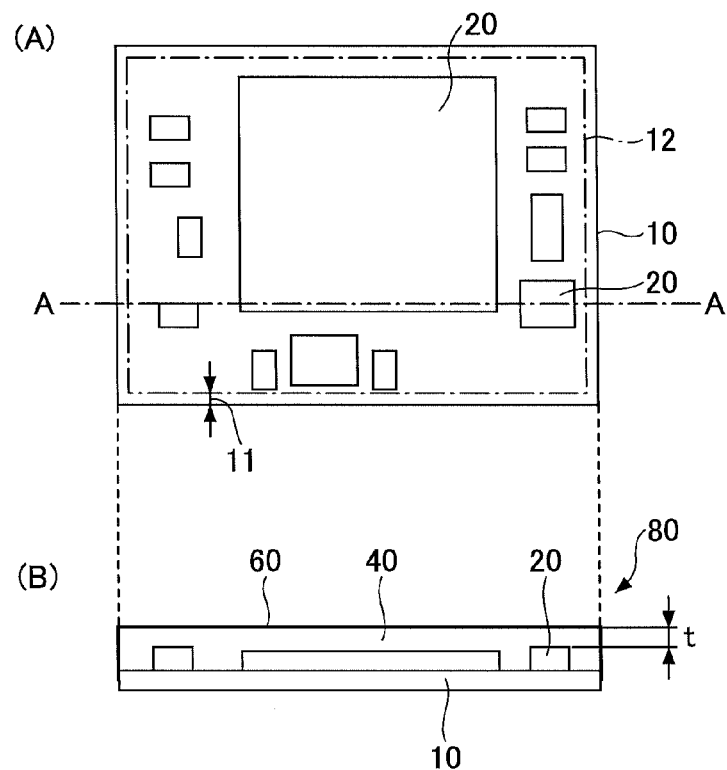
FIG. 2 is a view for explaining an example of layout and height of the electronic module of the embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

FIG. 1A is a cross-sectional view showing an example of an electronic module 85 of the embodiment. FIG. 1B is a plan view showing an example of the electronic module 85 of the embodiment. FIG. 1C is an enlarged cross-sectional view showing a part (surrounded by a circle) of the electronic module 85 shown in FIG. 1A.

As shown in FIG. 1A, the electronic module 85 of the embodiment includes a substrate 10, an electronic component 20, a mold resin 40, a shield film 60 and a protection film 70. The substrate 10, the electronic component 20 and the mold resin 40 compose a mold body 50.

In the electronic module 85, the electronic component 20 is mounted on the substrate 10 and is sealed by the mold resin 40 so that the mold body 50 is formed. Although only one electronic component 20 is shown in FIG. 1A, plural of the electronic components 20 may be mounted on the substrate 10 as shown in FIG. 2. The shield film 60 is formed to cover upper and side surfaces of the mold body 50. The protection film 70 is further formed on a surface of the shield film 60 at the top of the mold body 50.

FIG. 1B is an upper view of the electronic module 85 of the embodiment in which the protection film 70 is formed on the shield film 60. Although the protection film 70 is formed on the shield film 60 to cover almost the entirety of the shield film 60 on the upper surface of the mold body 50, the protection film 70 is not formed at the outer periphery of the shield film 60 (mold body 50). Thus, the shield film 60 is exposed at the circumference of the protection film 70. In this embodiment, a mark or a character, specifically, a management number 75 such as a manufacturing number or the like and a 1-pin mark 76 which indicates a position of a first pin are formed at the surface of the protection film 70.

It is not essential to provide the protection film 70 and the protection film 70 may be provided in accordance with necessity based on the purposes. Thus, in this embodiment, the electronic module with the protection film 70 is referred to as the electronic module 85, while the electronic module without the protection film 70 is referred to as the electronic module 80.

With reference to FIG. 1C, the substrate 10 and the electronic component 20 are connected via solder bumps 30. Further, a space between the substrate 10 and the electronic component 20 is filled with an underfill material 31. The mold resin 40 seals the electronic component 20 mounted on the substrate 10 to form the mold body 50. The shield film 60 is formed to cover the upper and side surfaces of the mold resin 40 of the mold body 50. The shield film 60 formed at the side surfaces of the mold resin 40 is further formed to extend over the substrate 10 to cover an upper part of side surfaces of the substrate 10. The protection film 70 is formed on the shield film 60 above the mold body 50 with a space from an outer edge of the mold body 50 as explained above with reference to FIG. 1B.

Thus, the electronic module 85 of the embodiment is manufactured by forming the mold body 50 by sealing the electronic component 20 mounted on the substrate 10 with the mold resin 40, forming the shield film 60 to cover the upper and side surfaces of the mold body 50 and the side surfaces of the substrate 10, forming the protection film 70 at a center portion of the shield film 60 above the mold body 50, and forms the mark or character on the protection film 70.

The components shown in FIG. 1A to FIG. 10 are explained in detail.

The substrate 10 is a circuit substrate including circuits having a predetermined function when the electronic component 20 is mounted. Circuit interconnects are formed at a surface and inside of the substrate 10. The substrate 10 may be made of any materials provided being capable of mounting the electronic component 20 and composing circuits having the predetermined function. The substrate 10 may be made of glass epoxy resin or the like, for example.

The substrate 10 may be a multilayer substrate. By using a multilayer substrate as the substrate 10, various circuit interconnects may be formed in the substrate 10. By connecting an upper interconnect and a lower interconnect, different circuit interconnects may be formed at an upper layer and a lower layer. Thus, a complicated circuit interconnects can be formed in the substrate 10.

The electronic component 20 may be selected from various components required for the function of the electronic module 85. The electronic component 20 may be a Wafer level Chip Size Package (WLCSP). With this, the size of the electronic component 20 (IC) can be made small and the electronic module 85 can also be made small.

The solder bumps 30 electrically and physically connect the electronic component 20 and the substrate 10 when the electronic component 20 is mounted on the substrate 10. The underfill material 31 is a filling which fills the physical space between the electronic component 20 and the substrate 10 to strengthen the connection between the electronic component 20 and the substrate 10. With the function of the underfill material 31, the electronic component 20 can be stably mounted on the substrate. The underfill material 31 may be a liquid thermosetting resin, specifically, epoxy resin or the like, for example.

The mold resin 40 is formed by molding to seal the electronic component 20 mounted on the substrate 10. By forming the mold body 50 in which the electronic component 20 is sealed by molding, the electronic module 85 can be made smaller compared with a case using the metal shield case. Here, the mold resin 40 is molded to selectively cover the upper surface of the substrate 10 while sealing the electronic component 20 without covering the side surfaces and a back side surface of the substrate 10.

As the mold resin 40 seals the electronic component 20 mounted on the substrate 10, the height of the mold resin 40 becomes higher than that of the electronic component 20. However, the mold resin 40 may be formed to be as low as possible in order to make the electronic module 85 small.

The mold body 50 is a unit which has a circuit with a predetermined function. Thus, the mold body 50 itself may be used as an electronic module. However, in this embodiment, the electronic module 85 is structured to include the shield film 60 for electro-magnetic wave shielding so that the electronic module 85 (mold body 50) can be shielded from the electro-magnetic wave to appropriately and safely actualize the function of the electronic module 85.

The shield film 60 is a metal evaporated film (metalized film) for shielding the circuit substrate 10 and the electronic component 20 from the electro-magnetic wave. By composing the shield film 60 by the metal evaporated film, the shield film 60 can be made uniform to increase a shield effect of the shield film 60. The thickness of the shield film 60 may be determined in accordance with the purposes, and may be 1 to 2 μm or 1 to a few μm, for example. With this, the electronic module 85 can be made small.

The shield film 60 may be a metal evaporated film formed by Physical Vapor Deposition (PVD). By PVD, the metal evaporated film can be formed while controlling the direction of the ionized metal so that the uniform shield film 60 can be formed at desired positions at the upper and side surfaces of the mold body 50. For example, among PVD, the shield film 60 may be formed by ion plating by which ionized metal is vaporized onto an object (in this case the mold body 50). With this method, the vaporized particles are ionized and directed toward the mold body 50 at a high speed so that ionized particles collide with the mold body 50 to enable a high adhesion. Further, according to PVD, the metal evaporated film can be made as thin as 1 to 2 μm.

The electronic module 85 may have various functions, and for example, the electronic module 85 may be a wireless module or a high-frequency module for wireless communication. The wireless module or the high-frequency module includes a large amount of components or circuit components for which shielding is necessary. The wireless module or the high-frequency module may include components or circuit components for which electro-magnetic wave shielding is necessary such as a pattern of a Radio Frequency (RF) unit, a filter such as a Band Pass Filter (BPF), a Low Pass Filter (LPF), a Surface Acoustic Wave (SAW) filter or the like, a high-frequency switch, a power amplifier, a low noise amplifier, a high-frequency matching component (L, C, R) or the like. Thus, the electronic module 85 of the embodiment may be used for a wireless module or a high-frequency module, for example.

The shield film 60 may be made of an appropriate material in accordance with the purposes, and may be made of aluminum or alloy including aluminum, for example. As aluminum is reasonable and has a high conductivity, aluminum may be used for the shield film 60. The alloy including aluminum may be alloy including aluminum and copper, or an alloy including aluminum and tin, for example. Alternatively, the shield film 60 may be made of copper or an alloy including copper. The shield film 60 may be made of a material selected from various metal materials.

The protection film 70 which covers the upper surface of the shield film 60 functions to strengthen the adhesion of the shield film 60 as well as protecting the shield film 60. Further, the protection film 70 may have a function of insulating the shield film 60 from other conductive components. The protection film 70 may be made of a material selected from various insulating materials, and may be made of a thermosetting resist coat material, for example.

A mark or character may be easier to be recognized when it is formed on the protection film 70 compared with a case when it is formed on the shield film 60 which is the metal evaporated film. Thus, the protection film 70 also functions as a medium on which the mark or the character is formed. The mark or the like is generally formed by a laser marking or printing, and contrast can be made greater when the resist coat material is used compared with a case when the metal evaporated film is used so that the mark or the like can be clearly formed.

The mark or the like to be formed on the protection film 70 may be determined in accordance with the purposes. Generally, the mark or the like to be formed on the protection film 70 may be a management number such as a manufacturing number or the like, a 1-pin mark which indicates a position of a first pin of a chip to be connected and indicates the position of the chip. Thus, in this embodiment, an example where the management number 75 and the 1-pin mark 76 are formed is shown.

As described above, according to the electronic module 85 (80) of the embodiment, the size can be made small as well as the various components and circuits included therein are appropriately sealed.

FIG. 2 is a view for explaining an example of a layout and height of the electronic module 80. In FIG. 2, (A) is a plan view showing an example of a layout of plural of the electronic modules 20 mounted on the substrate 10, and (B) is a cross-sectional view of the electronic module 80 taken along an A-A line in (A) of FIG. 2.

In (A) of FIG. 2, the plural electronic components 20 are mounted on the surface of the substrate 10. The electronic components 20 are to be mounted within a component mounting area 12 provided on the substrate 10. In order to seal the electronic components 20 mounted on the substrate 10 by the mold resin 40 by molding, the electronic components 20 cannot be mounted on the entire space on the substrate 10 and a space is necessary at the outer periphery of the substrate 10. The width of the space is referred to as a "molding space 11". Thus, the component mounting area 12 becomes an area on the substrate 10 except the outer periphery corresponding to the molding space 11. Thus, the component mounting area 12 is limited to be within an area except the molding space 11 at the outer periphery of the substrate 10 in a plan view.

Further, in (B) of FIG. 2, the cross-sectional view of the electronic module 80 of the embodiment is shown. Here, the height of the electronic module 80 becomes a total of the thickness of the substrate 10, the maximum height of the electronic component 20, the thickness "t" of the mold resin 40 and the thickness of the shield film 60. As explained above, when the thickness of the shield film 60 is about 1 to 2 μm, for example, and the thickness "t" of the mold resin 40 is set to be the minimum necessary, the electronic module 80 can be formed with a very low height.

Figure 5A:
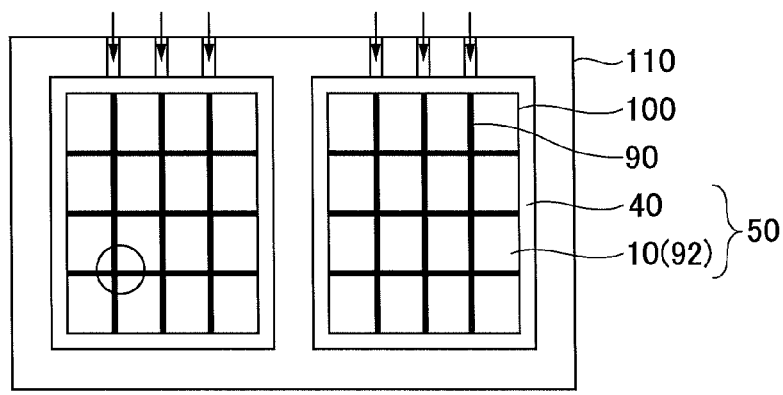
FIG. 5A is a plan view showing an example of mold bodies before being cut.

With reference to FIG. 5A, which will be explained in detail later though, the mold body 50 is formed by dicing (cutting) a larger substrate 100 in which plural circuit areas 92, which correspond to the substrate 10, respectively, are formed. Each of the circuit areas 92 is surrounded by dicing lines 90 which are formed in a grid form. Under this situation, plural of the electronic components 20 are mounted on the plural circuit areas 92, respectively. Then, the substrate 100 on which the plural electronic components 20 are mounted is molded by the mold resin 40. Subsequently, the substrate 100 is cut along the dicing lines 90 to obtain the plural of the mold bodies 50 corresponding to the circuit areas 92, respectively.

Figure 3:
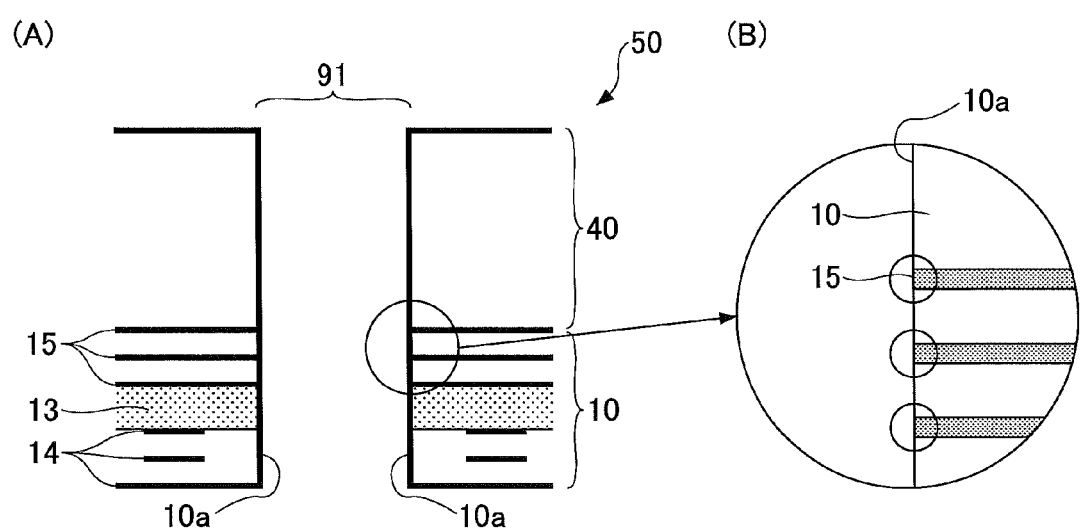
FIG. 3 is a schematic view showing a cross-sectional structure of a mold body of the electronic module of the embodiment.

FIG. 3 is a schematic view showing a cross-sectional structure of the mold body 50. In FIG. 3, (A) is a cross-sectional view of the mold body 50, and (B) is an enlarged cross-sectional view showing a part (surrounded by a circle) of the mold body 50 shown in (A) of FIG. 3.

As shown in (A) of FIG. 3, the substrate 10 is composed of six metal layers including wiring patterns 14 and ground patterns 15. The substrate 10 has a stacked structure of a core material 13, the wiring patterns 14, the ground patterns 15 and insulating layers (pre-preg or the like) formed between the wiring patterns 14 and the ground patterns 15. Specifically, the wiring patterns 14 are formed below the core material 13 and the ground patterns 15 are formed above the core material 13. The ground patterns 15 are grounded.

The core material 13 is a base material which positions at a center of the substrate 10, which is a multilayer substrate and a build-up substrate. The substrate 10 is formed by forming each layer above and below the core material 13. At this time, the wiring patterns 14 and the ground patterns 15 are also formed. The wiring patterns 14 are formed to compose circuit interconnects in the substrate 10 so that the wiring patterns 14 may not be exposed at side surfaces 10a of the substrate 10. On the other hand, in this embodiment, the ground patterns 15 are to be connected to the shield film 60 to ground the shield film 60, so that the ground patterns 15 are formed to be exposed at the side surfaces 10a of the substrate 10.

In (A) of FIG. 3, two of the mold bodies 50 facing with each other are shown. A groove 91 is formed between the mold bodies 50. The groove 91 is formed when dicing the substrate 100 (see FIG. 5A) along the dicing lines 90. In order to have the ground patterns 15 exposed at the side surfaces 10a of the substrate 10, the ground patterns 15 are formed to extend along the adjacent circuit areas 92 (substrates 10). On the other hand, the wiring patterns 14 are formed within each of the circuit areas 92.

In FIG. 3, (B) shows an enlarged view of the ground patterns 15. The ground patterns 15 are exposed at the side surface 10a of the substrate 10. With this structure, by forming the shield film 60 to cover the side surface 10a of the substrate 10, the shield film 60 can be electrically connected with the exposed ground patterns 15 so that the shield film 60 can be grounded.

The wiring patterns 14 and the ground patterns 15 may be composed of various materials in accordance with the purposes. For example, the wiring patterns 14 and the ground patterns 15 may be made of copper. As copper is reasonable and has a high conductivity, copper may be used for the wiring materials in the substrate 10.

Figure 4A:
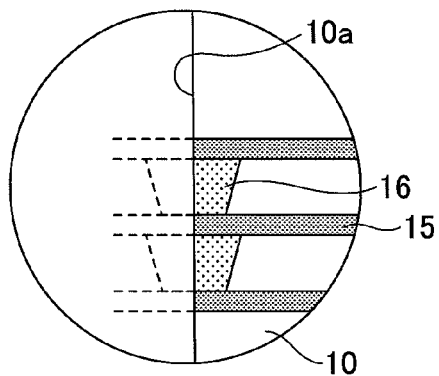
FIG. 4A is a cross-sectional view showing an example of a side surface of a substrate before a shield film is formed.
Figure 4B:
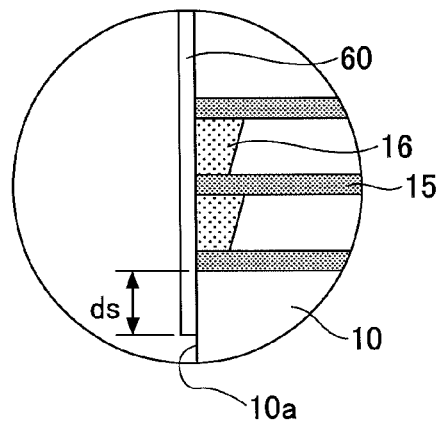
FIG. 4B is a cross-sectional view showing an example of the side surface of the substrate after the shield film is formed.

FIG. 4A and FIG. 4B are views showing an example of the side surface 10a of the substrate 10 of the electronic module 85 where the shield film 60 is to be formed. FIG. 4A shows an example of the side surface 10a of the substrate 10 before the shield film 60 is formed, and FIG. 4B shows an example of the side surface 10a of the substrate 10 after the shield film 60 is formed.

FIG. 4A shows a cross-sectional structure of the substrate 10, similar to (B) of FIG. 3. The ground patterns 15 formed in the different layers are connected by vias 16 formed in through holes in the substrate 10. In this embodiment, the vias 16 connected to the ground patterns 15 are formed to be exposed at the side surface 10a of the substrate 10. It means that the vias 16 connected to the ground patterns 15 are cut when dicing the substrate 100 (see FIG. 5A) along the dicing lines 90. With this structure, an area of the grounded conductive materials which are to contact the shield film 60 can be increased.

FIG. 4B shows a structure in which the shield film 60 is formed to cover the side surface 10a of the substrate 10. In this embodiment, as explained above, the vias 16 are formed to be exposed at the side surface 10a of the substrate 10 and a contacting area with the shield film 60 can be increased. Here, the shield film 60 is formed to extend for a distance ds from the lowest ground pattern 15 so that the shield film 60 can completely cover the ground patterns 15 and the vias 16 which are exposed at the side wall 10a of the substrate 10. With this, contacting resistance can be lowered. Further, when the ground patterns 15 and the vias 16 are made of copper, oxidation of copper can also be suppressed.

Figure 5B:
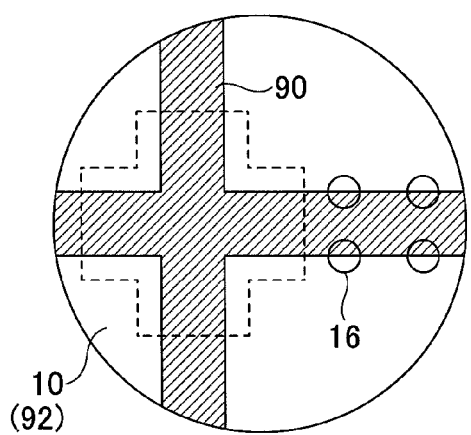
FIG. 5B is an enlarged plan view showing a part near dicing lines shown in FIG. 5A.
Figure 5C:
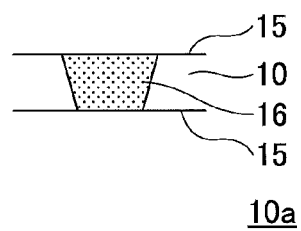
FIG. 5C is a cross-sectional view showing a via exposed at the side surface of the substrate by dicing.

FIG. 5A to FIG. 5C are schematic views for explaining an example of a dicing step (individualizing step) of the embodiment. FIG. 5A is a plan view showing an example of the mold bodies 50 before being cut, FIG. 5B is an enlarged plan view showing a part (surrounded by a circle) near the dicing lines 90 shown in FIG. 5A, and FIG. 5C is a cross-sectional view showing the via 16 exposed at the side surface 10a of the substrate 10 by dicing.

As explained above, the substrates 10 are obtained by dicing (cutting) the larger substrate 100 in which the plural circuit areas 92 are formed. In this embodiment, plural (in this case two) of the substrates 100 are placed on a sheet substrate 110. Each of the plural circuit areas 92, corresponding to each of the substrates 10, is surrounded by the dicing lines 90. Here, the dicing lines 90 are virtual lines and are not actually drawn on the sheet substrate 110. The width of the dicing lines 90 may be appropriately set in accordance with a width of a blade of a dicer, and may be about 0.3 mm. for example. In this embodiment, plural of the electric components 20 are mounted on the plural circuit areas 92, respectively, and each of the substrates 100 is sealed by the mold resin 40, as shown in FIG. 5A.

FIG. 5B shows an intersection of two crossing dicing lines 90 where four circuit areas 92 (substrates 10) are shown. As shown in FIG. 5B, the vias 16 are formed to cross interfaces between the dicing line 90 and the circuit areas 92 (substrates 10), respectively. Further, although not shown in FIG. 5B, in this embodiment, the ground patterns 15 are formed to extend between plural circuit areas 92 (substrates 10), crossing the dicing lines 90. With this structure, when the substrate 100 is diced, the ground patterns 15 and the vias 16 are exposed at the side surface 10a of the substrate 10.

The ground patterns 15 and the vias 16 may not be formed at the intersection of two crossing dicing lines 90 surrounded by a dotted line in FIG. 5B. At the intersection, burrs of the ground patterns 15 and the vias 16 are easy to be generated when dicing. Especially, when the ground patterns 15 and the vias 16 are made of copper, as copper is soft, the burrs are easy to remain at the corner portions of the substrate 10. This will be explained later in detail.

FIG. 5C shows the side surface 10a of the substrate 10 after being diced. As shown in FIG. 5C, the via 16 having a contacting area with the shield film 60 far larger than that of the ground pattern 15 is exposed in addition to the ground patterns 15 so that the electrical connection between the shield film 60 can be ensured.

Figure 6:
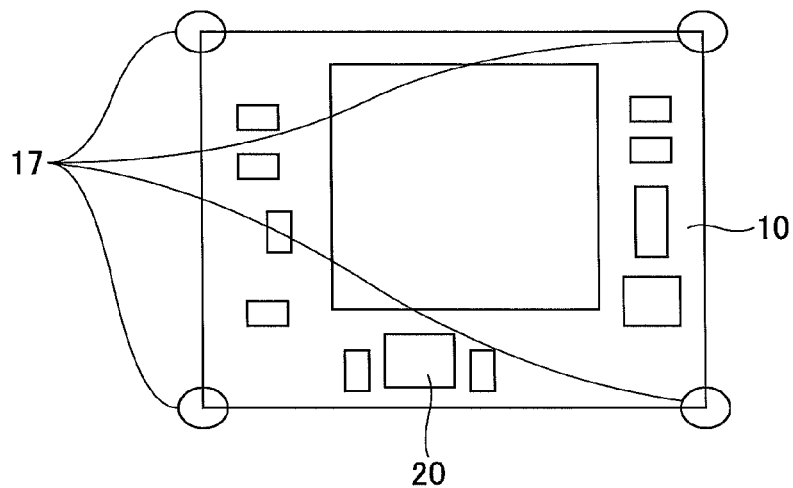
FIG. 6 is a view for explaining an example of layout of ground patterns.

FIG. 6 is a view for explaining an example of a layout of the ground patterns 15. In FIG. 6, plural of the electronic components 20 are mounted on the substrate 10. Further, four corner portions 17 of the substrate 10 are shown in FIG. 6.

As explained above with reference to FIG. 3 to FIG. 5C, in order to enlarge the exposed area of the ground patterns 15 (and/or the vias 16) at the side surface 10a of the substrate 10 to increase the contacting area with the shield film 60, it is preferable to layout the ground patterns 15 (and/or the vias 16) to be exposed at the possible entirety of the outer periphery of the substrate 10.

However, as explained above with reference to FIG. 5B, the mold bodies 50 are obtained by dicing the larger substrate 100. When dicing the larger substrate 100 and when the ground patterns 15 and the vias 16 are made of copper, if such the copper film is positioned at the corner portions 17, burrs may remain. Thus, in this embodiment, the ground patterns 15 and the vias 16 are positioned to be exposed at the side surface 10a of the substrate 10 but not at the corner portions 17 in order to prevent the burrs from being generated. It means that the ground patterns 15 (and the vias 16) are not positioned at the corner portions 17 in FIG. 6. Further, the ground patterns 15 (and the vias 16) are positioned at the outer periphery of the substrate except the corner portions 17. With this structure, the burrs are not generated and the contacting area between the ground patterns 15 and the vias 16 with the shield film 60 can be increased.

Figure 7:
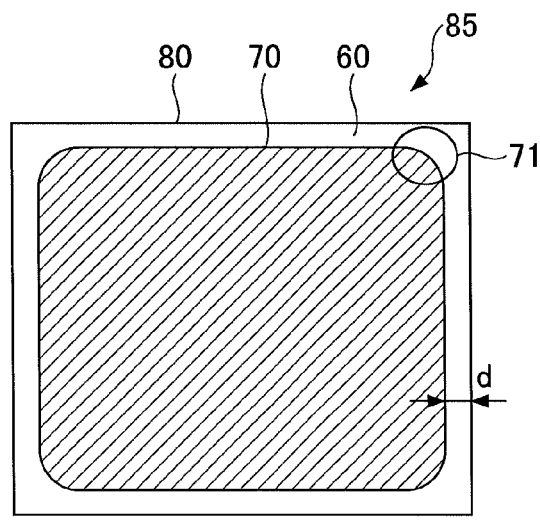
FIG. 7 is a plan view showing an example of a structure of a protection film.

FIG. 7 is a plan view showing an example of a structure of the protection film 70. In FIG. 7, an upper surface of an example of the electronic module 85 is shown. Here, the protection film 70 is formed by printing, such as screen printing a resist coat material on the surface of the shield film 60, for example. The thickness of the protection film 70 may be set in accordance with various purposes. The purposes may be a protection of the shield film 60, marking, insulation or the like. When laser marking is performed in a following step, a material having a color totally different from that of the shield film 60 may be used.

As the screen printing is formed after the shield film 60 is formed, the screen printing is performed for each of the individualized electronic modules 80. When screen printing, the plural electronic modules 80 are fixed on a tray or the like, a screen printing plate provided with plural openings corresponding to the plural electronic modules 80, respectively, is placed above the tray, a resist coat material is supplied to the openings of the screen printing plate, and the resist coat material is flattened by a squeegee. However, there may be a misalignment between the electronic modules 80 and the openings of the screen printing plate.

If the opening of the screen printing plate does not match the upper surface of the respective electronic module 80, the resist coat material may adhere to the side surface of the electronic module 80. In such a case, the protection film 70 which adheres to undesired positions may cause a trouble. Thus, it is necessary to selectively form the protection film 70 on the upper surface of the electronic module 80. Thus, the protection film 70 is to be formed at a position inside an area where the misalignment of the screen printing plate may occur.

As shown in FIG. 7, the protection film 70 is formed on the shield film 60, and is positioned to be within an area from a distance "d" from the outer edge of the electronic module 80. The distance "d" may be determined to be larger than an expected misalignment amount between the screen printing plate and the electronic module 80. Thus, even when the misalignment between the screen printing plate and the electronic module 80 occurs, the protection film 70 is selectively formed on the upper surface of the electronic module 80.

Further, the protection film 70 is formed to have round corner portions 71. As there may be a variance of the resist coat material in thickness at the corner portions, the protection film 70 is formed to have the round corner portions 71 in order to reduce such a variance. However, the shape of the protection film 70 may be arbitrary determined.

The mark or the like may be formed on the protection film 70 using a laser marker, for example, by which a part of the protection film 70 is evaporated to be removed. The mark or the like to be formed may be determined in accordance with purposes, and may be, for example, a 1-pin mark, a type number, a lot number or the like.

The method of manufacturing the electronic module 85 is explained with reference to FIG. 8 to FIG. 14B.

Figure 8:
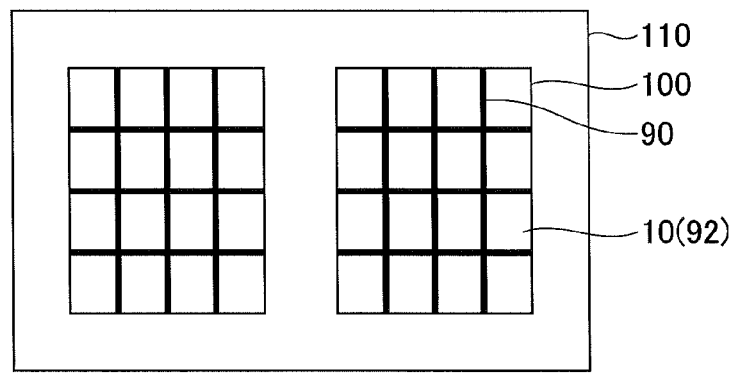
FIG. 8 is a plan view showing an example of a substrate preparing step of a method of manufacturing the electronic module of the embodiment.

FIG. 8 is a plan view showing an example of a substrate preparing step in the method of manufacturing the electronic module 85 of the embodiment. In the substrate preparing step, the substrate 100, which are to be divided into the plural substrates 10 is prepared.

As described above, the substrate 100 includes the plural circuit areas 92 each of which is surrounded by the dicing lines 90. Here, the circuit area 92 is larger than the component mounting area 12 (see FIG. 2).

At this time, in each of the circuit areas 92, circuit interconnects such as the wiring patterns 14, the ground patterns 15 and the vias 16 are formed. The ground patterns 15 are formed to pass across the plural circuit areas 92 and the dicing lines 90. The vias 16 are formed at the interfaces between the dicing lines 90 and the circuit areas 92. The ground patterns 15 and the vias 16 are not formed at the intersection of the crossing dicing lines 90 shown as a cross in FIG. 5B.

After the substrate 100 is prepared, the substrate 100 may be formed on the sheet substrate 110, and plural of the substrates 100 may be formed on the sheet substrate 110. In FIG. 8, two of the substrates 100 are formed on the sheet substrate 110.

Then, the components 20 are mounted on each of the circuit areas 92 (the substrates 10), respectively. The components 20 may be mounted using a Surface Mounter. Further, the electronic component 20 may be bonded to the respective substrate 10 by soldering using the solder bumps 30. At this time, reflowing may be performed in soldering. The electronic component 20 may be a WLCSP.

After, the components 20 are mounted, the substrate 100 may be washed in accordance with necessary.

Figure 9A:
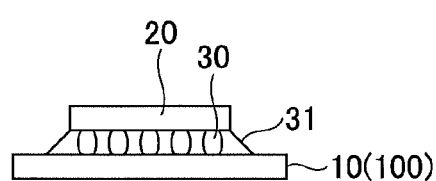
FIG. 9A and FIG. 9B are schematic views showing an example of an underfill filling step in the method of manufacturing the electronic module.
Figure 9B:
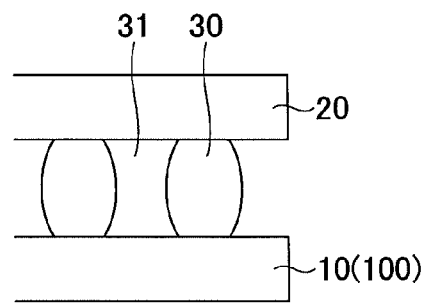

FIG. 9A and FIG. 9B are schematic views showing an example of an underfill filling step in the method of manufacturing the electronic module 85. FIG. 9A is a cross-sectional view showing an example of the underfill filling step. FIG. 9B is an enlarged cross-sectional view showing a relationship between the solder bumps 30 and the underfill material 31 in the underfill filling step.

As shown in FIG. 9A, the underfill material 31 is filled between the electronic components 20 and the substrates 10 (the substrate 100) in the underfill filling step. As shown in FIG. 9B, as each of the substrates 10 and the respective electronic component 20 are bonded with the solder bumps 30, the underfill material 31 is provided to fill the space between the respective electronic component 20 and the substrate 10 formed by the solder bumps 30. The underfill material 31 may be, for example, thermosetting resin such as epoxy resin or the like and is heated to be cured to fill the space between the substrate 10 and the electronic component 20. It is not essential to perform the underfill filling step and this step may be performed in accordance with the necessity.

Figure 10:
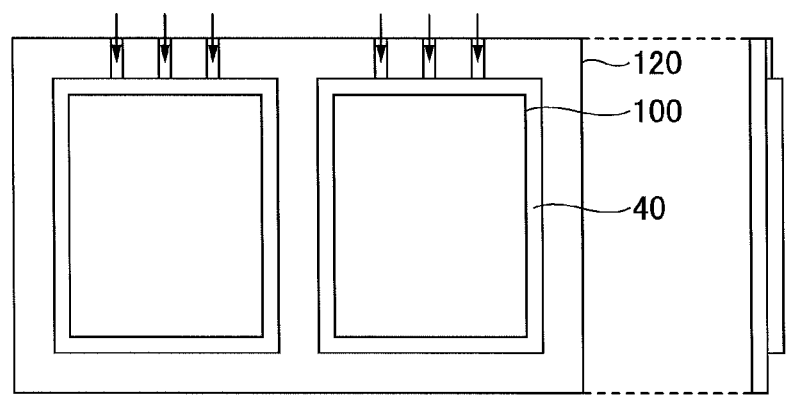
FIG. 10 is a schematic view showing an example of a molding step in the method of manufacturing the electronic module.

FIG. 10 is a schematic view showing an example of a molding step in the method of manufacturing the electronic module 85. In the molding step, the sheet substrate 110 is placed in a die 120. Then, the mold resin 40 is provided into the die 120 and the mold resin 40 are formed for each of the substrates 100. With this, the mold body 50 is formed for each of the substrates 100.

Figure 11:
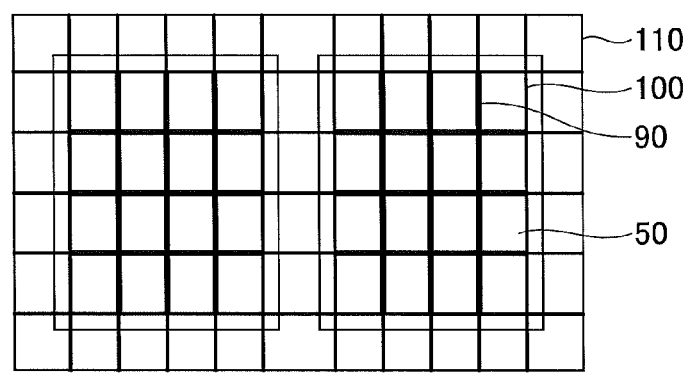
FIG. 11 is a schematic view showing an example of a dicing step in the method of manufacturing the electronic module.

FIG. 11 is a schematic view showing an example of a dicing step in the method of manufacturing the electronic module 85. In the dicing step, the substrate 100 and the sheet substrate 110 are cut along the dicing lines 90 so that individual mold bodies 50 can be obtained.

Here, for the mold resin 40, an oil component such as a wax component may exist at the surface after being cured. If such an oil component exists, the adhesion between the mold resin 40 and the shield film 60 becomes worse. Thus, a wax removing step in which the upper surface side of the mold resin 40 is momentarily burned may be performed.

Figure 12A:
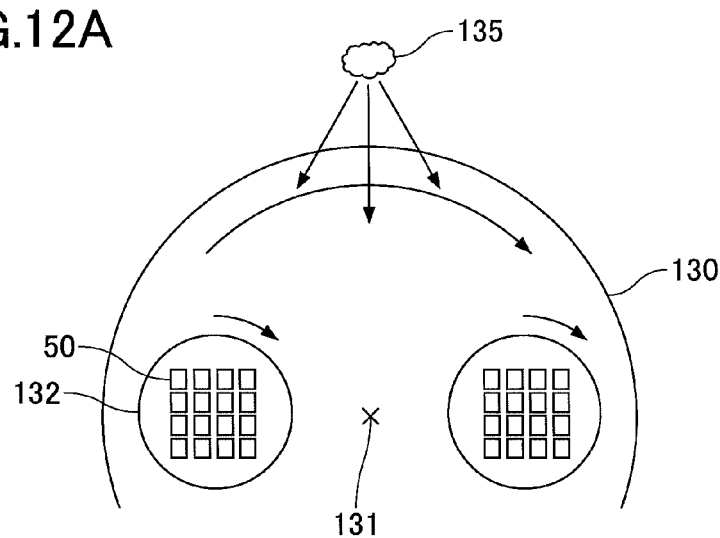
FIG. 12A and FIG. 12B are schematic views showing a shield film forming step in which the shield film is formed for each of the electronic modules.
Figure 12B:
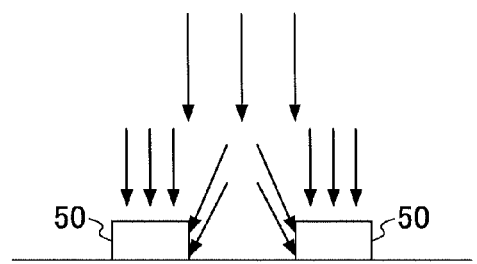

FIG. 12A and FIG. 12B are schematic views showing a shield film forming step in which the shield film 60 is formed for each of the mold bodies 50. FIG. 12A is a plan view, and FIG. 12B is a cross-sectional view.

As shown in FIG. 12A, the metal evaporated film is formed on the upper and side surface of each of the mold bodies 50 by PVD in the shield film forming step. The PVD may be ion plating as described above. The plural mold bodies 50 are placed on a tray 132. Then, plural of such trays 132, on each of which the plural mold bodies 50 are placed, are placed on a stage 130 under a vacuumed atmosphere. Then, the stage 130 is rotated around a shaft 131 and the tray 132 is also rotated by itself. Under this condition, a metal material 135 such as aluminum or the like is evaporated and provided from the upper side to be collided at the surfaces of the mold bodies 50. As the mold bodies 50 are rotated by the stage 130 and also by the respective tray 132, the evaporated film can be uniformly formed also to the side surfaces of each of the mold bodies 50.

As shown in FIG. 12B, as the evaporated metal material collides the surfaces of the mold bodies 50 from the inclined direction in addition to from the upper direction, the evaporated film can be formed at the side surfaces of the mold bodies 50. Further, by the rotations of the stage 130 and the tray 132 shown in FIG. 12A, the shield film 60 can be uniformly formed on the upper and side surfaces of each of the mold bodies 50.

In this step, as the evaporated film is formed by PVD, the shield film 60 can be made as a uniform thin film as thin as 1 to 2 μm, or to a few μm. When the mold bodies 50 are separated by dicing, it is hard to selectively form a metal film by a wet process such as electroless plating, electroplating or the like. Further, as described above, the apparatuses for forming such a metal film become larger to increase cost. However, according to PVD, especially ion plating, used in this embodiment, the direction of the ionized metal which is applied to the mold bodies 50 can be controlled. Further, the shield film 60 can be formed by a single process to decrease cost.

With this step, the electronic module 80 of the embodiment is manufactured. Further, in accordance with necessity, the protection film 70 is formed on the shield film 60, and the mark or the like is formed on the protection film 70.

Figure 13A:
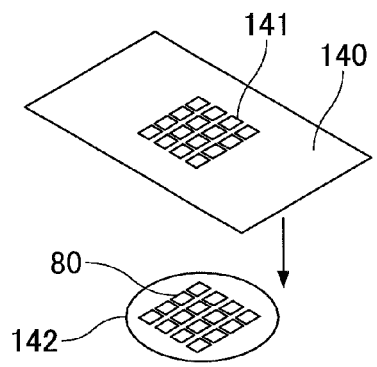
FIG. 13A and FIG. 13B are schematic views showing an example of a protection film forming step in the method of manufacturing the electronic module.
Figure 13B:
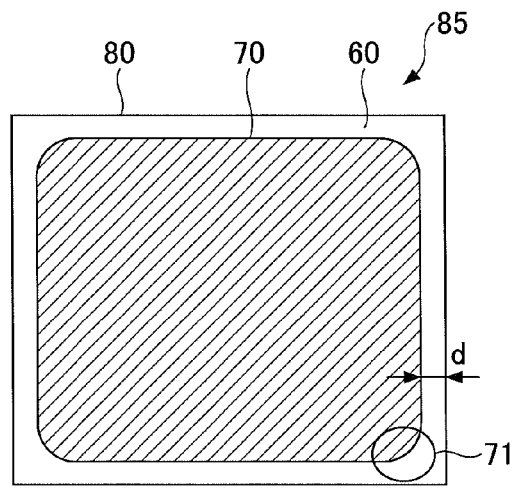

FIG. 13A and FIG. 13B are schematic views showing an example of a protection film forming step in the method of manufacturing the electronic module 85. FIG. 13A is a schematic view showing an example of the protection film forming step. FIG. 13B is a plan view showing an example of the protection film 70 formed in the protection film forming step.

As shown in FIG. 13A, the protection film 70 made of resist coat material is formed on the upper surface of the electronic module 80 by a screen printing method using a screen printing plate 140 in the protection film forming step. In the protection film forming step, the plural electronic modules 80 are placed on a tray 142. Then, the screen printing plate 140 provided with plural openings corresponding to the plural electronic modules 80 is placed above the tray 142, the resist coat material is supplied into the openings of the screen printing plate 140, and the resist coat material is evened by a squeegee (not shown in the drawings). Thus, as explained above with reference to FIG. 7, the screen printing plate 140 is formed to have the openings 141 each having the size and the shape as explained above so that the protection film 70 having the round corners 71 within the area from the distance "d" from the outer edge of the electronic module 80 is to be formed.

As shown in FIG. 13B, the protection film 70 is to be formed on the shield film 60 at the upper surface of the electronic module 80 with a predetermined distance "d" from an outer edge of the electronic module 80 and the round corner portions 71.

Figure 14A:
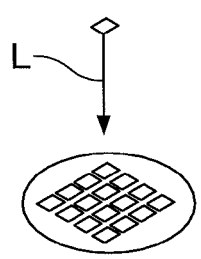
FIG. 14A and FIG. 14B are schematic views showing an example of a marking step in the method of manufacturing the electronic module.
Figure 14B:
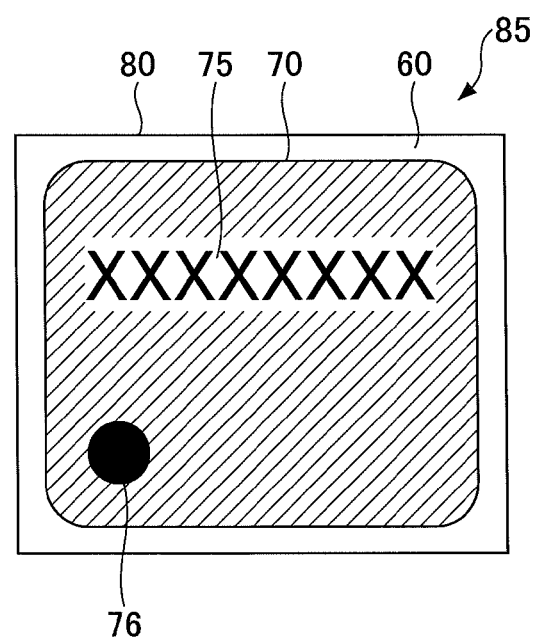

FIG. 14A and FIG. 14B are schematic views showing an example of a marking step in the method of manufacturing the electronic module 85. FIG. 14A is a schematic view showing an example of the marking step. FIG. 14B is a plan view showing an example of the mark or the like formed in the marking step.

As shown in FIG. 14A, in this embodiment, a laser marking using laser L is performed. In the laser marking, the laser L is irradiated on a predetermined area of the protection film 70 and a part of the protection film 70 on which the laser L is irradiated is evaporated by energy of the laser L to form the mark or the like. However, the mark or the like is to be formed not to reach the shield film 60. With this, the mark or the like is formed without decreasing the shield effect of the shield film 60. Thus, the energy of the laser L may be appropriately adjusted based on the kinds of material and the thickness of the protection film 70.

As shown in FIG. 14B, the management number 75 and the 1-pin mark 76 are printed on the protection film 70 to form the electronic module 85. By providing the protection film 70, the mark or the like can be clearly formed as the contrast of the mark or the like can be increased compared with a case when the mark or the like is formed in the shield film 60. Further, by selectively forming the mark or the like in the protection film 70, the marking can be performed without decreasing the shield effect of the shield film 60.

Although the laser marking is exemplified in this embodiment, another printing method may be used.

After the marking step, necessary tests are performed, taping is performed, and the electronic modules 85 are completed to be shipped or the like.

According to the electronic module and the method of manufacturing the electronic module of the embodiment, the electronic module with a small size having a shield effect can be provided with low cost.

The electronic module may be used for an electronic device including a communication device such as a mobile phone or the like.

Although a preferred embodiment of the electronic module and the method of manufacturing the electronic module has been specifically illustrated and described, it is to be understood that minor modifications may be made therein without departing from the spirit and scope of the invention as defined by the claims.

The present invention is not limited to the specifically disclosed embodiments, and variations and modifications may be made without departing from the scope of the present invention.

The present application is based on Japanese Priority Application No. 2012-20272 filed on Feb. 1, 2012, the entire contents of which are hereby incorporated by reference.

What is claimed is:

1. An electronic module comprising:
   a mold body in which an electronic component mounted on a circuit substrate is sealed by a mold resin; and
   a shield film formed to cover upper and side surfaces of the mold body, the shield film being a metal evaporated film formed by physical vapor deposition,
   wherein the circuit substrate includes a ground pattern which is formed so as to be exposed at a side surface of the circuit substrate except for vicinities of corner portions of the circuit substrate,
   wherein the shield film is connected to the ground pattern at the side surface of the circuit substrate except for the vicinities of the corner portions,
   wherein the circuit substrate is a multilayer substrate and includes a via exposed at the side surface of the circuit substrate and connected to the ground pattern,
   wherein the shield film is formed to contact the via at the side surface of the circuit substrate, and
   wherein the via and the ground pattern are formed so as to be exposed at the side surface of the circuit substrate except for the vicinities of the corner portions.

2. The electronic module according to claim 1,
   wherein the shield film is made of aluminum or an alloy including aluminum.

3. The electronic module according to claim 2,
   wherein the alloy including aluminum includes aluminum and copper, or aluminum and tin.

4. The electronic module according to claim 1,
   wherein the electronic component is a high-frequency component for wireless communication, and
   the circuit substrate is a high-frequency circuit substrate.

5. The electronic module according to claim 1, further comprising:
   a protection film formed on the shield film above the upper surface of the mold body, the protection film being selectively formed at an area from a predetermined distance from outer edges of the mold body.

6. The electronic module according to claim 5,
   wherein the protection film is formed by printing.

7. The electronic module according to claim 6,
   wherein the protection film is formed to have round corner portions.

8. The electronic module according to claim 5,
   wherein a mark or a character is formed on the protection film.

9. The electronic module according to claim 1,
   wherein the mark or the character is formed by laser marking or printing.

10. The electronic module according to claim 1,
    wherein each of the vicinities of the corner portions corresponds to intersections of two dicing lines.

* * * * *